United States Patent
Cho

(10) Patent No.: US 7,675,126 B2
(45) Date of Patent: Mar. 9, 2010

(54) METAL OXIDE SEMICONDUCTOR FIELD EFFECT TRANSISTOR AND METHOD OF FABRICATING THE SAME

(75) Inventor: Yong Soo Cho, Daejun-shi (KR)

(73) Assignee: Dongbu Electronics Co., Ltd., Seoul (KR)

( * ) Notice: Subject to any disclaimer, the term of this patent is extended or adjusted under 35 U.S.C. 154(b) by 335 days.

(21) Appl. No.: 11/320,302

(22) Filed: Dec. 29, 2005

(65) Prior Publication Data

US 2006/0163674 A1 Jul. 27, 2006

(30) Foreign Application Priority Data

Dec. 30, 2004 (KR) .................. 10-2004-0117128

(51) Int. Cl.
*H01L 29/76* (2006.01)
(52) U.S. Cl. .................. 257/404; 257/344; 257/345; 257/408; 257/E29.053; 257/E29.278
(58) Field of Classification Search .......... 257/336, 257/344, 404, 408, 345, E29.278, E29.049, 257/E29.053, E29.055
See application file for complete search history.

(56) References Cited

U.S. PATENT DOCUMENTS

| | | | |
|---|---|---|---|
| 6,476,448 B2 * | 11/2002 | Yeh et al. .................. 257/351 |
| 6,864,507 B2 * | 3/2005 | Yokogawa et al. ............ 257/77 |
| 2002/0093064 A1 * | 7/2002 | Inaba .......................... 257/408 |
| 2006/0097318 A1 * | 5/2006 | Li .............................. 257/347 |

FOREIGN PATENT DOCUMENTS

| | | |
|---|---|---|
| JP | 63-284858 | 11/1988 |
| JP | 09-246534 | 9/1997 |

OTHER PUBLICATIONS

Rejection from the Korean Patent Office mailed May 18, 2006, in Korean Patent Application No. 10-2004-0117128.

* cited by examiner

*Primary Examiner*—Matthew E Warren
(74) *Attorney, Agent, or Firm*—Finnegan, Henderson, Farabow, Garrett & Dunner, L.L.P.

(57) ABSTRACT

There are provided a MOSFET and a method for fabricating the same. The MOSFET includes a semiconductor substrate, a first epitaxial layer in a predetermined location of the semiconductor substrate, a second epitaxial layer doped with high concentration impurity ions on the first epitaxial layer, a gate structure on the second epitaxial layer, and source/drain regions with lightly doped drain (LDD) regions. The first epitaxial layer supplies carriers to the second epitaxial layer so that short channel effects are reduced.

14 Claims, 3 Drawing Sheets

METAL OXIDE SEMICONDUCTOR FIELD EFFECT TRANSISTOR AND METHOD OF FABRICATING THE SAME

RELATED APPLICATIONS

This application is based on and claims priority to Korean Patent Application No. 10-2004-0117128, filed Dec. 30, 2004, the entire contents of which are incorporated herein by reference.

BACKGROUND OF THE INVENTION

1. Technical Field

The present invention relates to a transistor, and more particularly, to a metal oxide semiconductor field effect transistor (MOSFET) and a method of fabricating the same.

2. Description of the Related Art

To achieve a higher integration of semiconductor devices, the size of the semiconductor devices needs to be reduced. Particularly, a critical dimension (CD), which generally equals the length of a gate electrode of a metal oxide semiconductor field effect transistor (MOSFET), needs to be reduced. However, a reduced CD results in a reduced channel length of a MOSFET, which causes various problems often referred to as short-channel effects.

Short channel effects deteriorate the characteristics of the MOSFET. For instance, as the channel length decreases, a threshold voltage decreases, a drain induced barrier lowering (DIBL) phenomenon occurs, and a leakage current between a drain and a source increases.

In order to prevent or alleviate the short channel effects, there is proposed a method for implanting impurities for threshold voltage adjustment over an entire surface of a channel. However, this method does not allow high integration of semiconductor devices.

Alternative methods for alleviating the short channel effects have also been proposed. For example, in order to adjust a vertical doping profile, a super steep retrograde (SSR) well or a pocket implantation may be formed. For another example, halo ion implantation regions formed in lower portions of the source/drain regions may also be formed to reduce the short channel effects.

FIG. 1 is a cross-sectional view of a semiconductor device illustrating a related art method for forming halo ion implantation regions.

Referring to FIG. 1, a gate oxide 7 and a gate electrode 9 are formed on a semiconductor substrate 1. Semiconductor substrate 1 may comprise silicon. Semiconductor substrate 1 includes a low concentration impurity region 3 and a high concentration impurity region 5 acting as a source or drain region on each side of gate oxide 7 and gate electrode 9. Oxide spacers 11 are formed on sidewalls of gate electrode 9 and gate oxide 7.

To form halo ion implantation regions 13, impurities are implanted into lower portions of the source/drain regions using gate electrode 8 and oxide spacers 11 as an ion implantation mask. Halo ion implantation regions 13 prevent the reduction in the threshold voltage and preserve the channel mobility.

However, a problem with the related art halo ion implantation method is that a junction capacitance may be increased and a junction depth is affected because the halo ion implantation regions are formed in source/drain regions as well as the semiconductor substrate region. Accordingly, when integration density is high, the threshold voltage of device with halo ion implantation regions is difficult to control.

SUMMARY OF THE INVENTION

Consistent with the the present invention, there is provided a metal oxide semiconductor field effect transistor (MOSFET) and a method for fabricating the same that substantially obviate one or more problems due to limitations and disadvantages of the related art. In particular, the present invention provides a MOSFET with reduced short channel effects and a method for fabricating the same.

A MOSFET consistent with embodiments of the present invention includes a semiconductor substrate; a first epitaxial layer in a predetermined location of the semiconductor substrate; a second epitaxial layer doped with high concentration impurity ions on the first epitaxial layer; a gate structure formed on the second epitaxial layer; and source/drain regions with lightly doped drain/source (LDD) structures in the semiconductor substrate.

Consistent with embodiments of the present invention, there is also provided a MOSFET that includes a first epitaxial layer in a semiconductor substrate; a second epitaxial layer doped with impurity ions as a channel in the semiconductor substrate, the second epitaxial layer being over the first epitaxial layer; a gate structure formed on the second epitaxial layer; and source/drain regions with lightly doped drain (LDD) regions, the source/drain regions being spaced apart by the first and second epitaxial layers.

Consistent with embodiments of the present invention, there is further provided a method for fabricating a MOSFET that includes implanting impurity ions into a semiconductor substrate; forming a first epitaxial layer undoped with the impurity ion and a second epitaxial layer doped with the impurity ion by an epitaxial growth; forming a gate structure on the second epitaxial layer, wherein the gate electrode includes a gate insulating layer and a gate conductive layer; and forming source/drain regions in the semiconductor substrate by implanting impurity ions using the gate structure as a mask layer.

The MOSFET consistent with embodiments of the present invention allows carriers in a predetermined layer formed under an channel region to be supplied to the channel region so that short channel effects may be reduced. Also, as a result of the increase in the concentration in the channel region, a decrease in the threshold voltage of the MOSFET is prevented.

Additional advantages and features of the invention will be set forth in part in the description which follows and in part will become apparent to those having ordinary skill in the art upon examination of the following or may be learned from practice of the invention. The features and other advantages of the invention may be realized and attained by the structure particularly pointed out in the written description and claims hereof as well as the appended drawings.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiments of the invention and together with the description serve to explain the principle of the invention. In the drawings.

DETAILED DESCRIPTION

Figure 1:
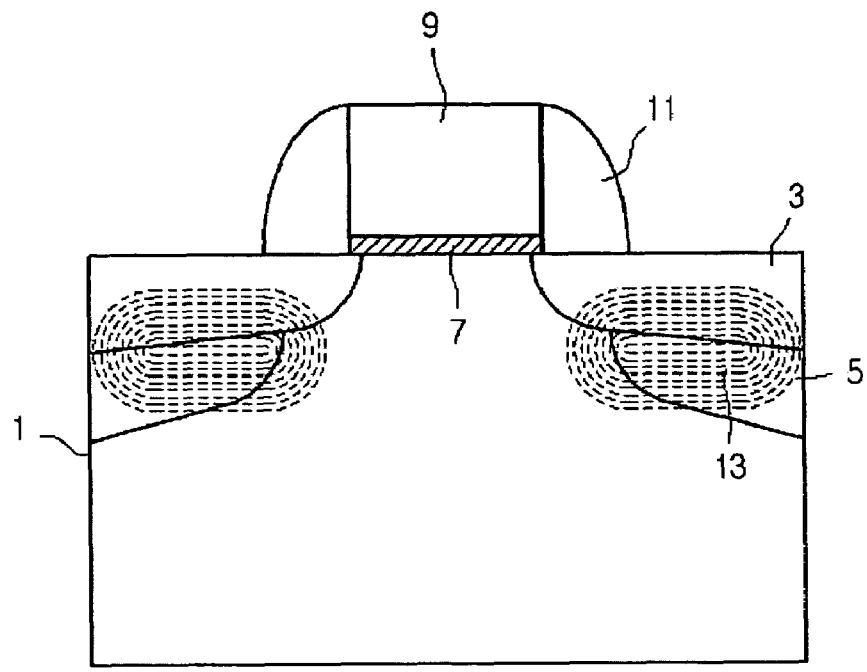
FIG. 1 is a cross-sectional view of a semiconductor device illustrating a related art halo ion implantation method.

Reference will now be made in detail to embodiments of the present invention, examples of which are illustrated in the accompanying drawings. The invention may, however, be embodied in many different forms and should not be construed as being limited to the embodiments suggested by an idea of the present invention. Thus, other embodiments which may be easily proposed by those skilled in the art through additions, modifications or deletions of elements, may also fall within the scope of the present invention.

In the drawings, the thickness of layers and regions are exaggerated for clarity. Like reference numerals in the drawings denote like elements.

FIGS. 2 to 5 are cross-sectional views illustrating a metal oxide semiconductor field effect transistor (MOSFET) and a method for fabricating the same consistent with embodiments of the present invention.

Figure 2:
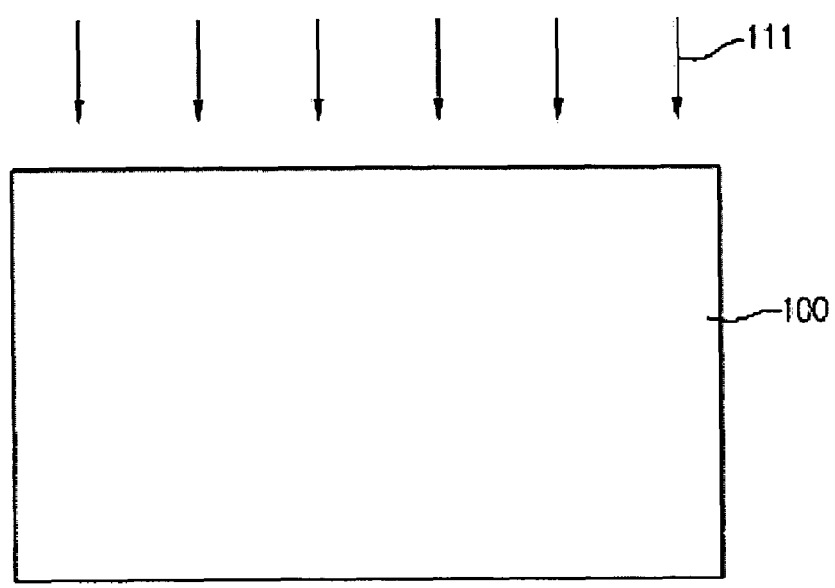
FIGS. 2 to 5 are cross-sectional views illustrating a metal oxide semiconductor field effect transistor (MOSFET) and a method for fabricating the same consistent with embodiments of the present invention.

In FIG. 2, an ion implantation process is performed to form a well in a semiconductor substrate 100 such as a silicon substrate or the like. The ion implantation for forming the well includes a punch through (P/T) implantation and a threshold (Vt) implantation. In detail, arrows 111 in FIG. 2 denote the impurities implanted into semiconductor substrate 100. Impurities 111 may comprise any impurities suitable for a desired semiconductor device.

Additional ion implantation processes may be performed using different ion implantation masks to form additional impurity regions. For example, if the ion implantation process shown in FIG. 2 forms an n-type well region, an additional ion implantation process may be performed to form a p-type well region. Similarly, if the ion implantation process shown in FIG. 2 forms a p-type well region, an additional ion implantation process may be performed to form an n-type well region.

Figure 3:
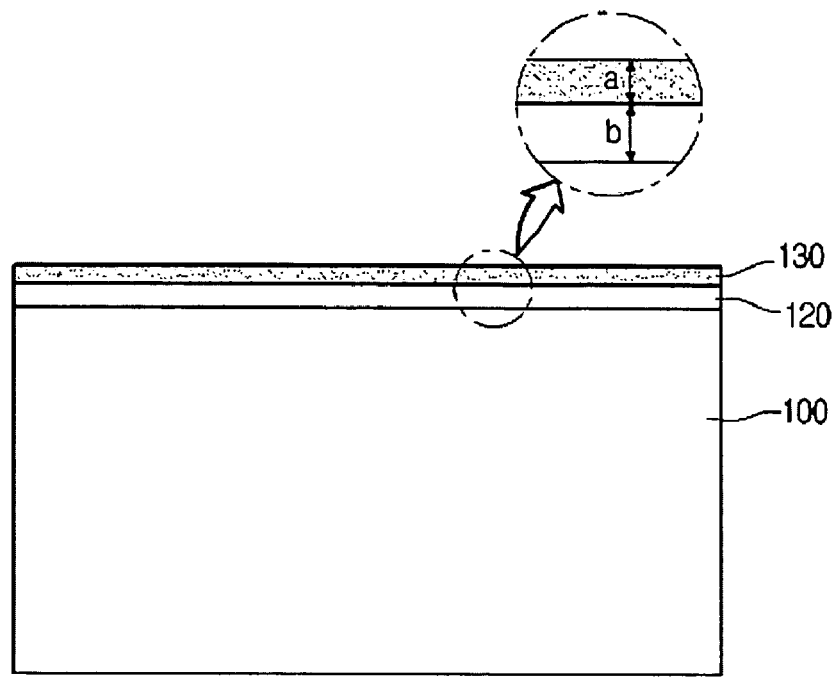

Referring to FIG. 3, the surface of semiconductor substrate 100 is epitaxially grown to form a first epitaxial layer 120 and a second epitaxial layer 130. A process for doping impurity ions may be performed in advance before forming epitaxial layers 120 and 130 so that second epitaxial layer 130 is doped with impurity ions and first epitaxial layer 120 is undoped with impurity ions.

Figure 4:
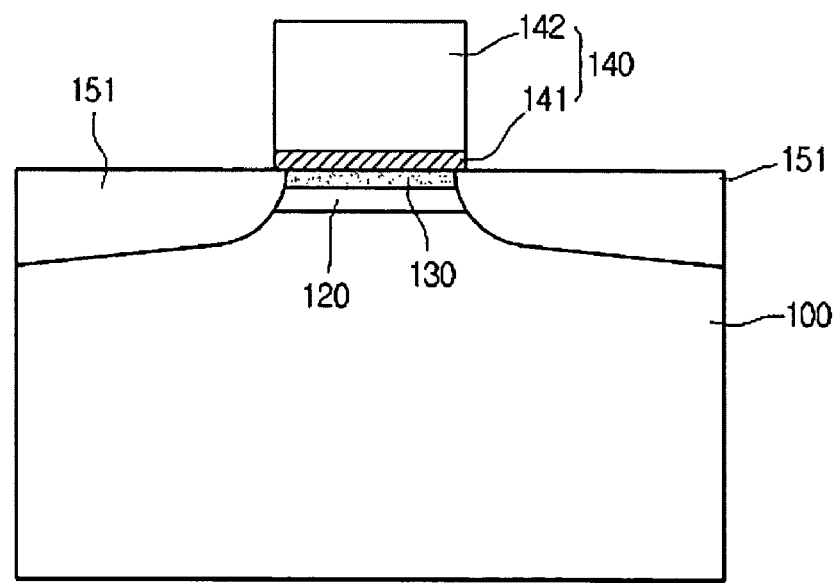

Referring to FIG. 4, a gate structure 140 is formed on second epitaxial layer 130. Gate structure 140 includes a gate insulating layer 141 and a gate conductive layer 142 stacked in sequence. A lightly doped drain (LDD) ion implantation is performed using gate structure 140 as a mask to form shallow source/drain extension regions 151.

Figure 5:
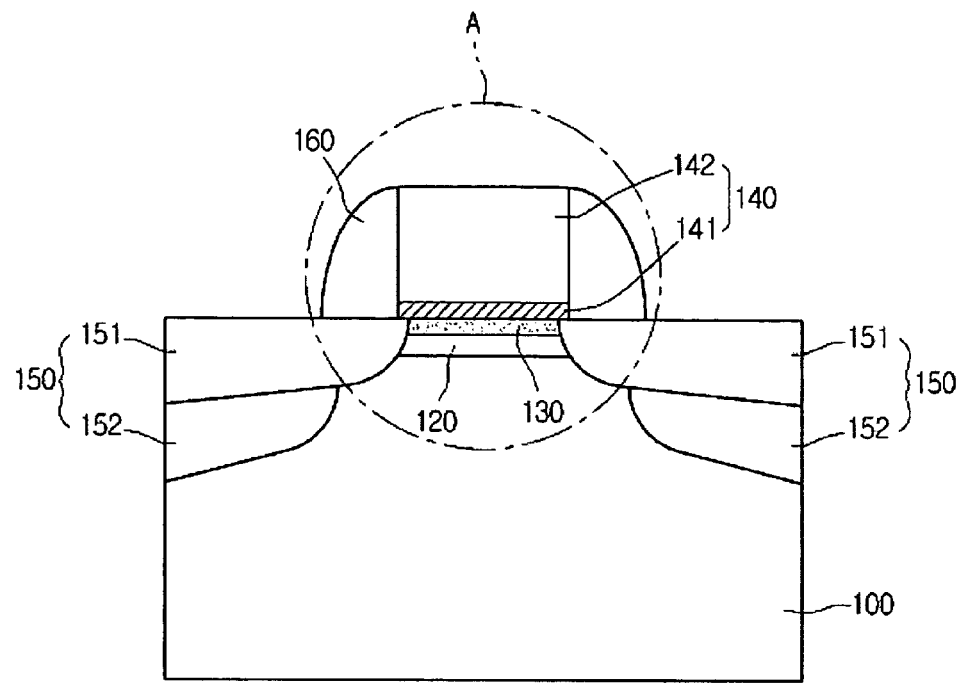

Referring to FIG. 5, after forming shallow source/drain extension regions 151, gate spacers 160 are formed on sidewalls of gate structure 140. An ion implantation is performed using gate structure 140 and gate spacers 160 as a mask to form deep source/drain regions 152. Deep source/drain regions 152 and shallow source/drain regions 151 together form source/drain regions 150. Source/drain regions 150 are spaced apart from each other by second epitaxial layer 130 and first epitaxial layer 120.

Thus, a transistor including gate structure 140, epitaxial layer 130 as the channel thereof, and source/drain regions 150 is formed. When voltages are applied to gate conductive layer 142 and source/drain regions 150, carriers move through the channel and a current flows through the transistor.

Meanwhile, a number of carriers in first epitaxial layer 120 may move into second epitaxial layer 130 and thereby increase a carrier concentration in second epitaxial layer 130. As a result, the transistor is effective for preventing a threshold voltage decrease due to a reduction in the thickness of gate insulating layer 141 and also due to short channel effects as the semiconductor device is highly integrated.

To ensure that carriers in first epitaxial layer 120 are effectively supplied to second epitaxial layer 130, first and second epitaxial layers 120 and 130 may be formed such that a ratio of a thickness a of second epitaxial layer 130 to a thickness b of first epitaxial layer 120 is a predetermined ratio, such as 1:2 to 1:4. For instance, referring to FIG. 3, when first epitaxial layer 120 has a thickness of 200 Å, epitaxial layer 130 may be formed to have a thickness of about 100 Å.

Figure 6:
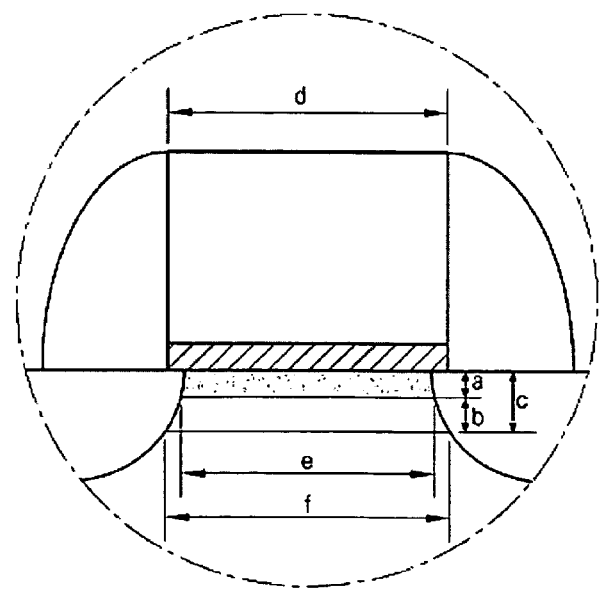
FIG. 6 is an enlarged view of a portion A illustrated in FIG. 5.

In addition, referring to FIG. 6, which is an enlarged view of a portion A illustrated in FIG. 5, a ratio of a total thicknesses c of first and second epitaxial layers 120 and 130 to a critical dimension (CD), which is equal to the length of gate structure 140, may be in a range of 1:3 to 1:4. Also referring to FIG. 6, the critical dimension may be equal to or greater than a horizontal length of second epitaxial layer 130 between source/drain regions 151, and equal to or less than a horizontal length of first epitaxial layer 120 between source/drain regions 151.

Although not illustrated in the figures or described above, a halo ion implantation region and/or a pocket ion implantation region may be formed to further reduce short channel effects.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A metal oxide semiconductor field effect transistor (MOSFET), comprising:
    a semiconductor substrate;
    a first epitaxial layer, undoped with impurity ions, at a predetermined location of the semiconductor substrate;
    a second epitaxial layer doped with high concentration impurity ions on the first epitaxial layer, wherein an upper surface of the first epitaxial layer contacts a bottom surface of the second epitaxial layer;
    a gate structure on the second epitaxial layer; and
    source/drain regions with lightly doped drain (LDD) regions in the semiconductor substrate.

2. The MOSFET according to claim 1, wherein the second epitaxial layer is formed by implanting impurity ions into the semiconductor substrate, and epitaxially growing a surface of the semiconductor substrate.

3. The MOSFET according to claim 1, wherein the second epitaxial layer acts as a channel region.

4. The MOSFET according to claim 1, wherein the first epitaxial layer supplies carriers to the second epitaxial layer.

5. The MOSFET according to claim 1, wherein a ratio of a thickness of the second epitaxial layer to a thickness of the first epitaxial layer is in a range of 1:2 to 1:4.

6. The MOSFET according to claim 1, wherein a ratio of a total thickness of the first and second epitaxial layers to a critical dimension of the MOSFET is in a range of 1:3 to 1:4.

7. The MOSFET according to claim 1, wherein a critical dimension of the MOSFET is equal to or greater than a horizontal length of the second epitaxial layer between the source/drain regions, and is equal to or less than a horizontal length of the first epitaxial layer between the source/drain regions.

8. The MOSFET according to claim 1, wherein the source/drain regions are separated by the first and second epitaxial layers.

9. A metal oxide semiconductor field effect transistor (MOSFET), comprising:
   a first epitaxial layer, undoped with impurity ions, in a semiconductor substrate;
   a second epitaxial layer doped with impurity ions as a channel in the semiconductor substrate, the second epitaxial layer being over the first epitaxial layer, wherein an upper surface of the first epitaxial layer contacts a bottom surface of the second epitaxial layer;
   a gate structure formed on the second epitaxial layer; and
   source/drain regions with lightly doped drain (LDD) regions, the source/drain regions being spaced apart by the first and second epitaxial layers.

10. The MOSFET according to claim 9, wherein the second epitaxial layer is formed by implanting impurity ions into the semiconductor substrate, and epitaxially growing a surface of the semiconductor substrate.

11. The MOSFET according to claim 9, wherein the first epitaxial layer supplies carriers to the second epitaxial layer.

12. The MOSFET according to claim 9, wherein a ratio of a thickness of the second epitaxial layer to a thickness of the first epitaxial layer is in a range of 1:2 to 1:4.

13. The MOSFET according to claim 9, wherein a ratio of a total thickness of the first and second epitaxial layers to a critical dimension of the MOSFET is in a range of 1:3 to 1:4.

14. The MOSFET according to claim 9, wherein a critical dimension of the MOSFET is equal to or greater than a horizontal length of the second epitaxial layer between the source/drain regions, and is equal to or less than a horizontal length of the first epitaxial layer between the source/drain regions.

* * * * *